(12) United States Patent
Tran

(10) Patent No.: US 8,793,536 B2
(45) Date of Patent: Jul. 29, 2014

(54) TEST AND MEASUREMENT INSTRUMENT WITH AUTO-SYNC FOR BIT-ERROR DETECTION

(75) Inventor: Que Thuy Tran, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 227 days.

(21) Appl. No.: 13/591,960

(22) Filed: Aug. 22, 2012

(65) Prior Publication Data

US 2014/0059384 A1    Feb. 27, 2014

(51) Int. Cl.
*G06F 11/22* (2006.01)
*G06F 11/26* (2006.01)

(52) U.S. Cl.
USPC .............................. 714/34; 714/35; 714/38.1

(58) Field of Classification Search
CPC . G06F 11/362; G06F 11/3644; G06F 11/368; G06F 11/3688
USPC ................... 714/33, 34, 35, 37, 38.1
See application file for complete search history.

(56) References Cited

U.S. PATENT DOCUMENTS

| | | | |
|---|---|---|---|
| 4,425,643 A * | 1/1984 | Chapman et al. | 714/724 |
| 4,654,848 A | 3/1987 | Noguchi | |
| 4,881,040 A | 11/1989 | Vaughn et al. | |
| 6,243,843 B1 * | 6/2001 | Parker et al. | 714/726 |
| 6,327,544 B1 | 12/2001 | Samuels | |
| 6,633,838 B1 * | 10/2003 | Arimilli et al. | 703/16 |
| 6,845,480 B2 * | 1/2005 | Wang | 714/741 |
| 2002/0106014 A1 | 8/2002 | Frisch et al. | |
| 2006/0069967 A1 | 3/2006 | Almay et al. | |
| 2006/0248410 A1 * | 11/2006 | Circello et al. | 714/47 |
| 2011/0041047 A1 | 2/2011 | Tran | |
| 2011/0271155 A1 | 11/2011 | Tran | |

OTHER PUBLICATIONS

European Search Report and Written Opinion for Application No. 13181245.5 dated Nov. 12, 2013, 6 pages.

* cited by examiner

*Primary Examiner* — Joseph Schell
(74) *Attorney, Agent, or Firm* — David A. Crowther; Thomas F. Lenihan; Marger Johnson & McCollom PC

(57) ABSTRACT

Embodiments of the invention include methods, apparatuses, and systems for automatically identifying a synchronization sub-pattern associated with a test pattern. A test and measurement instrument is triggered in response to a first instance of a trigger pattern in a data stream. A trigger-to-trigger counter begins counting at the time of the first trigger event. The test and measurement instrument is again triggered in response to a second instance of the trigger pattern in the data stream. The count is ended at this time. The count is then compared to a predefined length of the test pattern, and if equal, it is automatically determined that the trigger pattern is the unique synchronization sub-pattern associated with the test pattern.

22 Claims, 7 Drawing Sheets

TEST AND MEASUREMENT INSTRUMENT WITH AUTO-SYNC FOR BIT-ERROR DETECTION

BACKGROUND

Embodiments of the present invention relate to bit-error detection on a test and measurement instrument, and more particularly, to automatically searching and identifying a synchronization sub-pattern within a test pattern.

Test and measurement instruments, such as oscilloscopes, logic analyzers, or the like can be used to measure and analyze data. Test patterns can be generated and fed to a device under test (DUT). The test patterns can include signals that purposely stress the DUT. For example, the test patterns can include signal attenuation, jitter, or Spread Spectrum Clocking (SSC) to determine the operating margins of the DUT.

Bit error detection is performed by comparing the incoming bit stream with a pre-recorded correct pattern stored in memory of a test and measurement instrument. When testing is started, the test and measurement instrument waits for a synchronization sub-pattern in the input stream, and then starts comparing the incoming bits to the contents of the pre-recorded correct pattern. The synchronization sub-pattern is a unique sub-pattern in the whole repeated fixed-length test pattern.

The synchronization sub-pattern is not always known by the operator or other technical personnel involved with evaluating the DUT. It is difficult or sometimes impossible to manually identify the unique synchronization sub-pattern within the test pattern, especially if the test pattern is long or complex. One conventional approach is to repeatedly advance the selection of the candidate synchronization sub-pattern until no errors occur in the comparison of the incoming bit stream and the pre-recorded test pattern. But such approach is useful only when the incoming pattern does not contain any bit errors or pacing primitives in the signal while trying to determine the synchronization point. Moreover, such approach is resource intensive and inefficient.

Accordingly, a need remains for an improved system, method and apparatus for automatically searching for and identifying a synchronization sub-pattern within a test pattern for bit-by-bit error detection on a test and measurement instrument. Embodiments of the invention address these and other limitations in the prior art.

The foregoing and other features and advantages of the inventive concepts will become more readily apparent from the following detailed description of the example embodiments, which proceeds with reference to the accompanying drawings.

DETAILED DESCRIPTION

Reference will now be made in detail to embodiments of the present invention, examples of which are illustrated in the accompanying drawings. In the following detailed description, numerous specific details are set forth to enable a thorough understanding of the inventive concepts. It should be understood, however, that persons having ordinary skill in the art may practice the inventive concepts without these specific details. In other instances, well-known methods, procedures, components, circuits, and networks have not been described in detail so as not to unnecessarily obscure aspects of the embodiments.

It will be understood that, although the terms first, second, etc. may be used herein to describe various elements, these elements should not be limited by these terms. These terms are only used to distinguish one element from another. For example, a first input could be termed a second input, and, similarly, a second input could be termed a first input, without departing from the scope of the inventive concept.

The terminology used in the description of the various embodiments herein is for the purpose of describing particular embodiments only and is not intended to be limiting of the inventive concepts. As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The components and features of the drawings are not necessarily drawn to scale.

Figure 1:
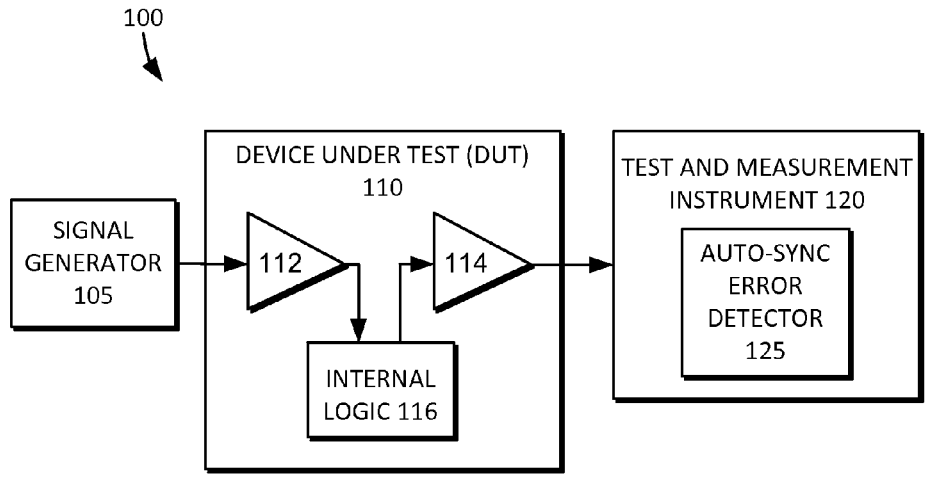
FIGS. 1 and 2 illustrate systems including a signal generator, a device under test, and a test and measurement instrument including an auto-sync error detector in accordance with embodiments of the present invention.
Figure 2:
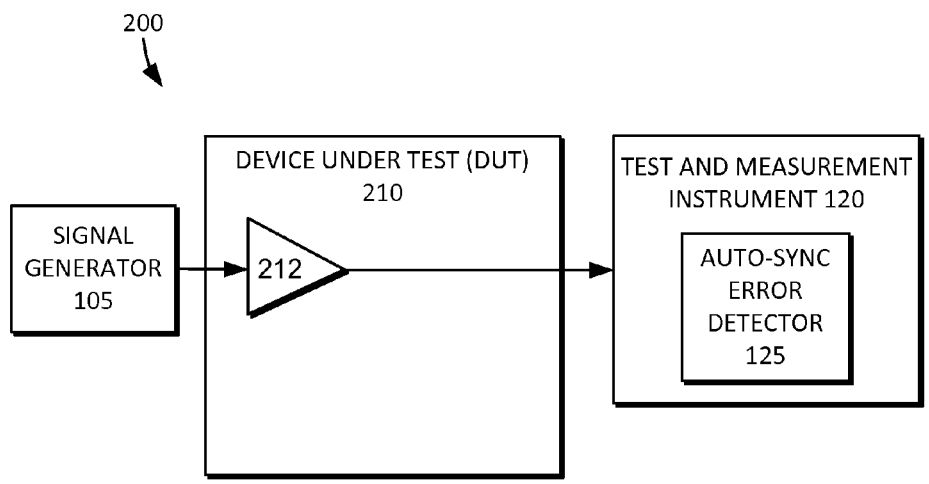

FIGS. 1 and 2 illustrate systems (e.g., 100 and 200) including a signal generator 105, a device under test (e.g., DUTs 110 and 210), and a test and measurement instrument 120 including an auto-sync error detector 125 in accordance with an embodiment of the present invention. The term "auto-sync" is an abbreviated form meaning automatic synchronization. The signal generator 105 can be any suitable device capable of generating a signal for testing purposes. The signal generator 105 can be, for example, a high speed serial generator such as an arbitrary waveform generator (AWG). The test signal that is generated can be purposely impaired with signal attenuation, jitter, Spread Spectrum Clock (SSC) and/or the like so that the DUTs can be stress tested. The test and measurement instrument 120 can be an oscilloscope, a logic analyzer, a spectrum analyzer, a network analyzer, or the like. Generally, for the sake of consistency and explanation, the test and measurement instrument 120 is referred to herein as an oscilloscope.

FIG. 1 illustrates a system 100 including a DUT 110. The DUT 110 can be any suitable digital or analog device capable of receiving and transmitting a signal. The DUT 110 can include, for example, a receiver 112, internal logic 116, and transmitter 114. An output of the DUT 110 can be coupled to the oscilloscope 120.

The oscilloscope 120 includes an auto-sync error detector 125, which is configured to automatically search for and identify a synchronization sub-pattern within a test pattern, and to detect and measure symbol error rates and bit error rates in the test pattern. A more detailed description of the auto-sync error detector 125 proceeds with reference to the FIGUREs that follow. In general, the DUT 110 can be configured as digital retimed loop back. Moreover, the system 100 can be configured to perform a receiver test with digital retimed loop back. Tests such as a Receive Margin Test can be performed using the oscilloscope 120 and the auto-sync error detector 125. The tests can be configured using a loop back mode, preferably a retimed loop back mode, to detect any error from the receiver of the DUT 110.

FIG. 2 illustrates a system 200 including a DUT 210. The DUT 210 can include, for example, a receiver 212. An output of the DUT 210 can be coupled to the test and measurement instrument 120. In general, the DUT 210 can be configured as analog loop back. Moreover, the system 200 can be configured to perform a receiver test with analog loop back. As with the system 100 mentioned above, tests such as a Receive Margin Test can be performed using the oscilloscope 120 and the auto-sync error detector 125. The tests can be configured using a loop back mode, preferably an analog loop back mode, to detect any error from the receiver of the DUT 210. Some components of the system 200 are the same as or similar to the components of system 100 discussed above, and therefore a detailed explanation of these is not repeated.

Figure 3:
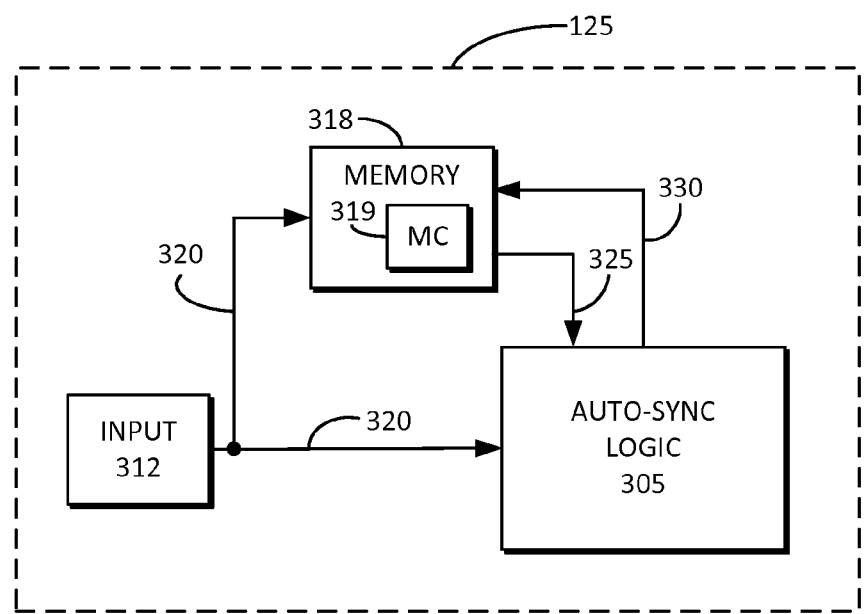
FIG. 3 illustrates an example block diagram of the auto-sync error detector 125 of FIGS. 1 and 2, including auto-sync logic in accordance with embodiments of the present invention.

FIG. 3 illustrates an example block diagram of the auto-sync error detector 125 of FIGS. 1 and 2, including an input 312, memory 318, and auto-sync logic 305 in accordance with embodiments of the present invention.

The input 312 is configured to receive a signal and output digitized data 320. In some embodiments, the signal can be a digital signal. In some embodiments, the signal can be an analog signal representing the digitized data 320. For example, the input 312 can include a clock and data recovery circuit (CDR). The CDR can recover the digitized data 320 encoded in the signal. In another embodiment, the input 312 can include an analog to digital converter configured to convert the signal into a digitized representation of the signal. Additional circuitry can convert the digitized signal into digitized data 320 of one form or another. It will be understood that any circuitry that can recover digitized data 320 encoded within the signal can be used as the input 312.

The digitized data 320 can be represented in a variety of formats. For example, the digitized data 320 can be serial data or parallel data. The digitized data 320 can include running disparity (RD) information, status information, and the like. The digitized data 320 can include additional information, signals, or the like associated with the data. For example, as described above, the input 312 can be a CDR. Thus, the digitized data 320 can include a recovered clock. In another example, the digitized data 320 can include framing information, such as frame errors, illegal code information, such as an illegal 8*b*/10*b* code sequence, synchronization loss information, or the like. Any such information can be included with the digitized data 320. In another example, digitized data 320 can be retimed de-multiplexed data from the CDR.

The memory 318 can be any variety of memory. The memory 318 is sometimes referred to herein as recording memory because it is configured to record the reference test pattern. The recording memory 318 can be dynamic memory, static memory, read-only memory, random-access memory, or the like. The recording memory 318 can be configured to store reference or pre-recorded digitized data including a reference test pattern. For example, the reference digitized data can be a pseudorandom bit sequence. The reference digitized data can be a particular series of ones or a series of zeros appropriate for the length of the pseudorandom pattern.

In another example, the reference digitized data can be a user-defined pattern, an industry standard pattern, or the like. The reference test pattern can be any sequence of data that is unique within the entire repeated pattern. In addition, the reference digitized data can include or be associated with a beginning synchronization sub-pattern, which can be used to align test procedures or error detection, described in detail below. The reference data can be stripped of any aligned primitives, shift sequences, or the like, prior to be saved in the recording memory 318. The reference data can be pre-recorded (i.e., recorded prior to the start of a test) by reading the test pattern from persistent storage (e.g., magnetic or optical disk drives) and writing the test pattern to the recording memory. In other words, the reference test pattern data can be previously written or otherwise pre-recorded into the memory 318 in preparation for testing the DUT. Alternatively, the reference test pattern data 325 can be learned through processing of data by the auto-sync error detector 125.

The recording memory 318 can include a memory controller 319. The memory controller 319 can be configured to cause the memory 318 to output the reference digitized data 325 in response to a control signal 330 from the auto-sync logic 305. In some embodiments, the memory controller 319 can be integrated with the memory 318. However, in another embodiment, the memory controller 319 can be separate from the memory 318. For example, the memory controller 319 can be part of a control system of the test and measurement instrument 120.

The oscilloscope 120 can receive, at its input, a serial data stream including a test pattern from the DUT. The test pattern has a predefined length, which can be determined based on the particular test configuration or testing parameters of the signal generator 105 and the DUT. Generally, the predefined length is fixed throughout a particular test. The auto-sync logic 305 and/or the memory 318 can receive the data stream 320 from the input 312. The auto-sync logic can take control of the recording memory 318 and sweep through the memory content automatically (i.e., read pre-recorded information), trigger the oscilloscope 120 multiple times using the pre-recorded information, and compare the length between the trigger events to the length of the overall test pattern as part of a technique to automatically determine a synchronization sub-pattern within the larger test pattern, as further described in detail below.

Figure 4A:
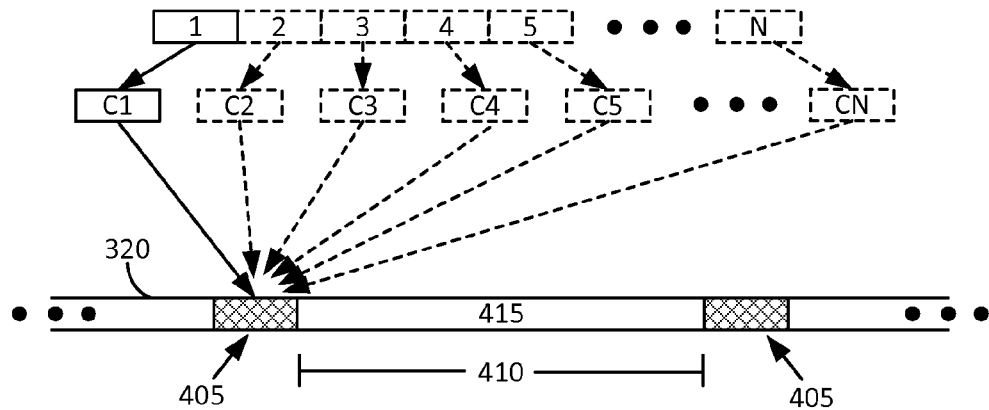
FIGS. 4A and 4B illustrate example diagrams related to a technique for automatically determining a synchronization sub-pattern within a test pattern in accordance with embodiments of the present invention.
Figure 4B:
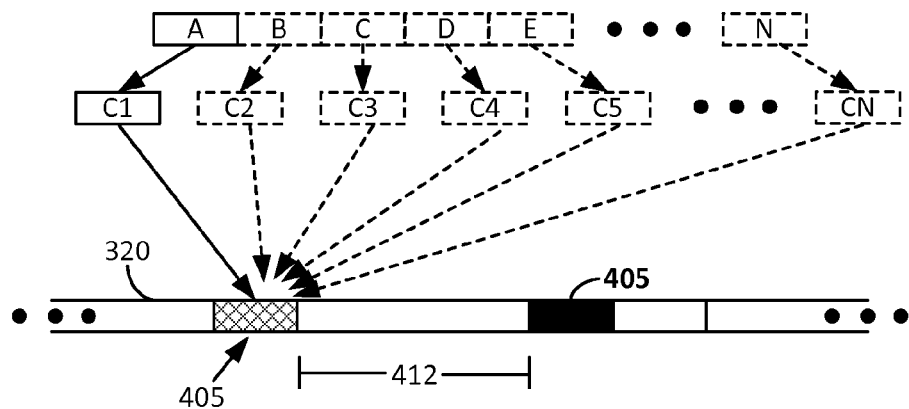

FIGS. 4A and 4B illustrate example diagrams related to a technique for automatically determining a synchronization sub-pattern within a test pattern. The auto-sync logic 305 (of FIG. 3) can automatically sweep through the memory address space of the memory 318. In other words, at each memory address 1, 2, 3, . . . , through N, the auto-sync logic 305 can read the content (e.g., C1, C2, C3, . . . , through CN) of that memory address. As the auto-sync logic 305 obtains the content of the memory at each address, it applies this content to be a serial trigger pattern 405 of a serial trigger of the oscilloscope 120.

The oscilloscope 120 is triggered if the serial trigger pattern 405 is detected in the incoming data stream 320. The auto-sync logic 305 measures the length 410 of time, or alternatively, the length 410 of the number of characters, between a first instance of the serial trigger pattern 405 and a second instance of the serial trigger pattern 405 found within the incoming data stream 320. If the measured length 410 between the trigger events is equal to the length of the predefined test pattern 415, as shown in FIG. 4A, then the serial trigger pattern 405 is determined to be the synchronization sub-pattern associated with the test pattern 415. Conversely, if the measured length 412 is not equal to the length of the predefined test pattern 415, as shown in FIG. 4B, then the serial trigger pattern 405 is determined to not be the synchronization sub-pattern associated with the test pattern 415, and the serial trigger pattern 405 is changed to a new value (e.g., from the memory contents C1 to the memory contents C2, and so forth through contents CN).

In this manner, the pre-recorded contents of the recording memory are iteratively read and applied as a candidate serial trigger pattern 405. At each iteration, the length between two instances of the trigger event is counted (i.e., within the incoming data stream 320), and the count is compared to the length 410 of the predefined test pattern 415. By performing such a comparison, the synchronization sub-pattern can be automatically determined with high accuracy and low false positives. When the synchronization sub-pattern is determined to be the unique and correct sub-pattern, it is saved for later use as a synchronization sub-pattern in connection with future bit-by-bit error detection tests.

Put differently, in response to a count not being equal to the predefined length of the test pattern, a series of iterations can be performed. For each of a series of iterations, the memory contents of a selected one of 2nd through Nth memory words associated with 2nd through Nth memory addresses can be read, respectively. For each of the series of iterations, the selected one of the 2nd through Nth memory words can be set as the trigger pattern. For each of the series of iterations, the trigger pattern can be loaded to the trigger, the test and measurement instrument can be triggered in response to detecting the first instance of the trigger pattern in the data stream, the count can be started in response to detecting the first instance of the trigger pattern, the test and measurement instrument can be triggered in response to detecting the second instance of the trigger pattern in the data stream, the count can be stopped in response to detecting the second instance of the trigger pattern, and the count can be compared to the predefined length of the test pattern. Moreover, in response to the count being equal to the predefined length of the test pattern during any of the series of iterations, it can be automatically determined that the trigger pattern for that iteration is the synchronization sub-pattern associated with the test pattern, and further iterations can be stopped.

Figure 5:
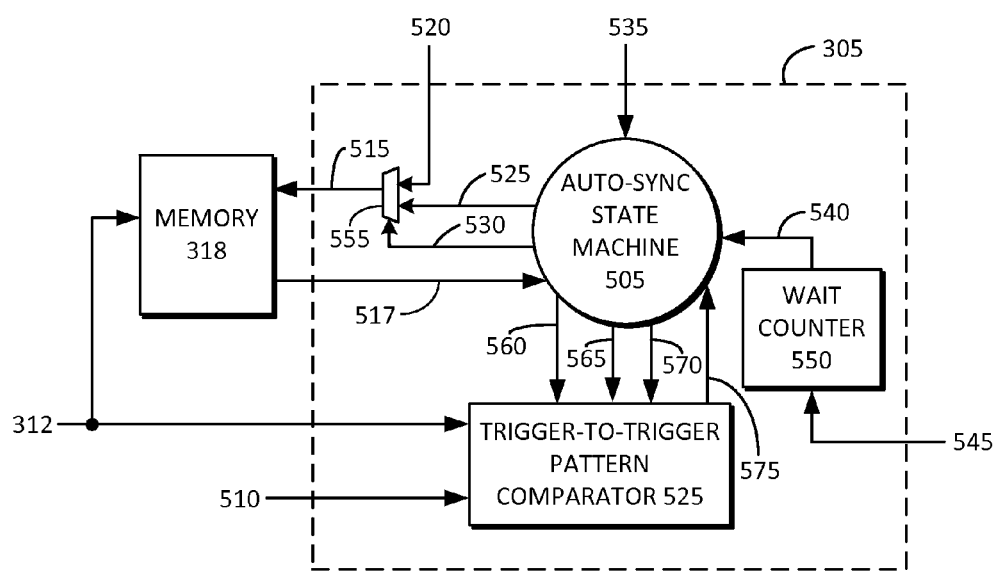
FIG. 5 illustrates an example block diagram of the auto-sync logic of FIG. 3, including a trigger-to-trigger pattern comparator and an auto-sync state machine in accordance with embodiments of the present invention.
Figure 6:
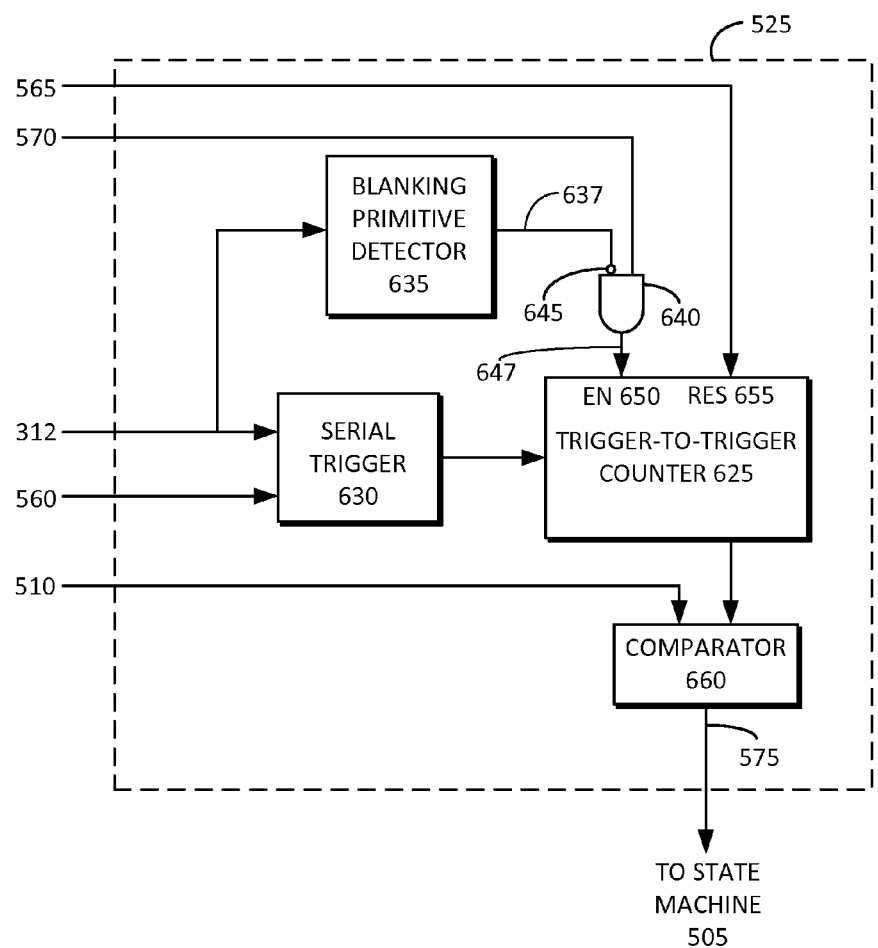
FIG. 6 illustrates an example block diagram of the trigger-to-trigger pattern comparator of FIG. 5.

FIG. 5 illustrates an example block diagram of the auto-sync logic of FIG. 3, including a trigger-to-trigger pattern comparator 525 and an auto-sync state machine 505 in accordance with embodiments of the present invention. FIG. 6 illustrates an example block diagram of the trigger-to-trigger pattern comparator 525 of FIG. 5. Reference is now made to FIGS. 5 and 6.

As shown in FIG. 5, the auto-sync state machine 505 can start operating in response to a write or auto-sync strobe 535, and can then take control of the memory 318 using selection signal 530 coupled to selector 555. The selector 555 can be a multiplexor or other suitable switch or control logic. The selector 555 can select between control signal(s) 525 from the auto-sync state machine 505 and control signal(s) 520 associated with other error detection state machines and/or logic (not shown). Depending on the selected signal, the control signal 515 is sent to the memory 318 (or memory controller 319). After taking control of the recording memory 318, the state machine 505 can sweep the memory addresses 517, one at a time, from beginning to end, or until the synchronization sub-pattern is identified. In other words, the state machine 505 can read the contents of memory words associated with memory addresses one at a time, and set the contents of each memory word as a serial trigger pattern 560. The serial trigger pattern 560 can be transmitted to the trigger-to-trigger comparator 525. The trigger-to-trigger comparator 525 includes a serial trigger 630, as shown in FIG. 6, which loads the serial trigger pattern 560.

The trigger-to-trigger pattern comparator 525 receives the incoming data stream 312 and the serial trigger 630 triggers in response to the serial trigger pattern 560 appearing in the incoming data stream 312. In other words, the oscilloscope is triggered in response to detecting a first instance of the trigger pattern 560 in the data stream 312. At this time, a trigger-to-trigger counter 625 may begin counting a count in response to detecting the first instance of the trigger pattern. The serial trigger 630 again triggers in response to a second instance of the serial trigger pattern 560 appearing in the incoming data stream 312. The trigger-to-trigger counter 625 ends the count in response to detecting the second instance of the trigger pattern 560. A comparator 660 can then compare the count to a predefined length of the test pattern, received over line 510. In other words, the spacing between the two trigger patterns can be compared to the overall length of the test pattern.

In response to the count being equal to the predefined length of the test pattern, the comparator 660 determines that the trigger pattern 560 is the synchronization sub-pattern associated with the test pattern, and can transmit an equality signal 575 to the auto-sync state machine 505. Conversely, in response to the count not being equal to the predefined length of the test pattern, the comparator 560 determines that the trigger pattern 560 is not the synchronization sub-pattern associated with the test pattern, and can transmit a non-equality signal 575 to the auto-sync state machine 505, which causes a new serial trigger pattern to automatically be set and loaded to the serial trigger 630.

The predefined length of the test pattern can be a length of time and the trigger-to-trigger counter 625 can be configured to count time. Alternatively, the predefined length of the test pattern can be a length of characters and the trigger-to-trigger counter 625 can be configured to count characters. Characters can refer to one or more words, symbols, bytes, and so forth.

The auto-sync state machine 505 can transmit a reset signal 565 and/or an enable signal 570 to the trigger-to-trigger pattern comparator 525. The reset signal 565 can be received at a reset pin 655 of the trigger-to-trigger counter 626. When asserted, the reset pin 655 can reset the count of the trigger-to-trigger counter 625. The count can be reset prior to detecting the first instance of the serial trigger pattern 560 in the incoming data stream 312, as explained above.

The enable signal 570 can be received at a logic gate 640 along with a blanking primitive detector signal 637. The output of the logic gate 640 is coupled to an enable pin 650 of the trigger-to-trigger counter 625 and causes the trigger-to-trigger counter 625 to proceed with counting or to skip counting portions of time or certain characters. For example, in one example embodiment, the logic gate 640 can include an inverter 645 at one input so that when the blanking primitive detector 635 detects an aligned primitive, or the like, in the incoming data stream 312, the detector signal 637 is inverted and fed to an AND gate along with the enable signal 570, thereby producing the enable signal 647 sent to the enable pin 650. It will be understood that any suitable selector, such as a multiplexor, can be used in place of the logic gate 640.

The blanking primitive detector 635 can cause the trigger-to-trigger counter 625 to skip any order sets, aligned primitives, clock alignment, shift sequences, or the like, which may be present in the incoming data stream 312. In other words, if there are portions of the data stream 312 that are to be ignored, the blanking primitive detector 635 can cause the trigger-to-trigger counter 625 to ignore or to not count those portions.

Referring again to FIG. 5, the auto-sync logic 305 can include a wait counter 550. The wait counter 550 is configured to begin counting a wait count in response to the first instance of the trigger pattern and to end counting the wait count in response to the wait count expiring after two times the predefined length, or at least two times the predefined length, of the test pattern, or thereabout. In response to the wait count expiring, the input (e.g., 312 of FIG. 3) is configured to stop receiving the data stream and the automatic synchronization logic 305 is configured to stop reading from the memory 318. This is an added safe-guard for any operation error. For example, whether or not the serial trigger pattern is unique, it is desirable to determine that within two pattern lengths, or thereabout, to avoid continuing a fruitless search for a serial trigger pattern, which might not exist at all within the incoming data stream. As such, the expiration of the wait count can be communicated via signal 540 to the state machine 505, which can stop the progress of the test and check for other settings, equipment configuration, and the like. The wait counter 550 can receive a wait value 545, which can be at least two times the predefined length of the test pattern, or any other suitable wait value in which the synchronization sub-pattern can be accurately and efficiently determined.

Figure 7:
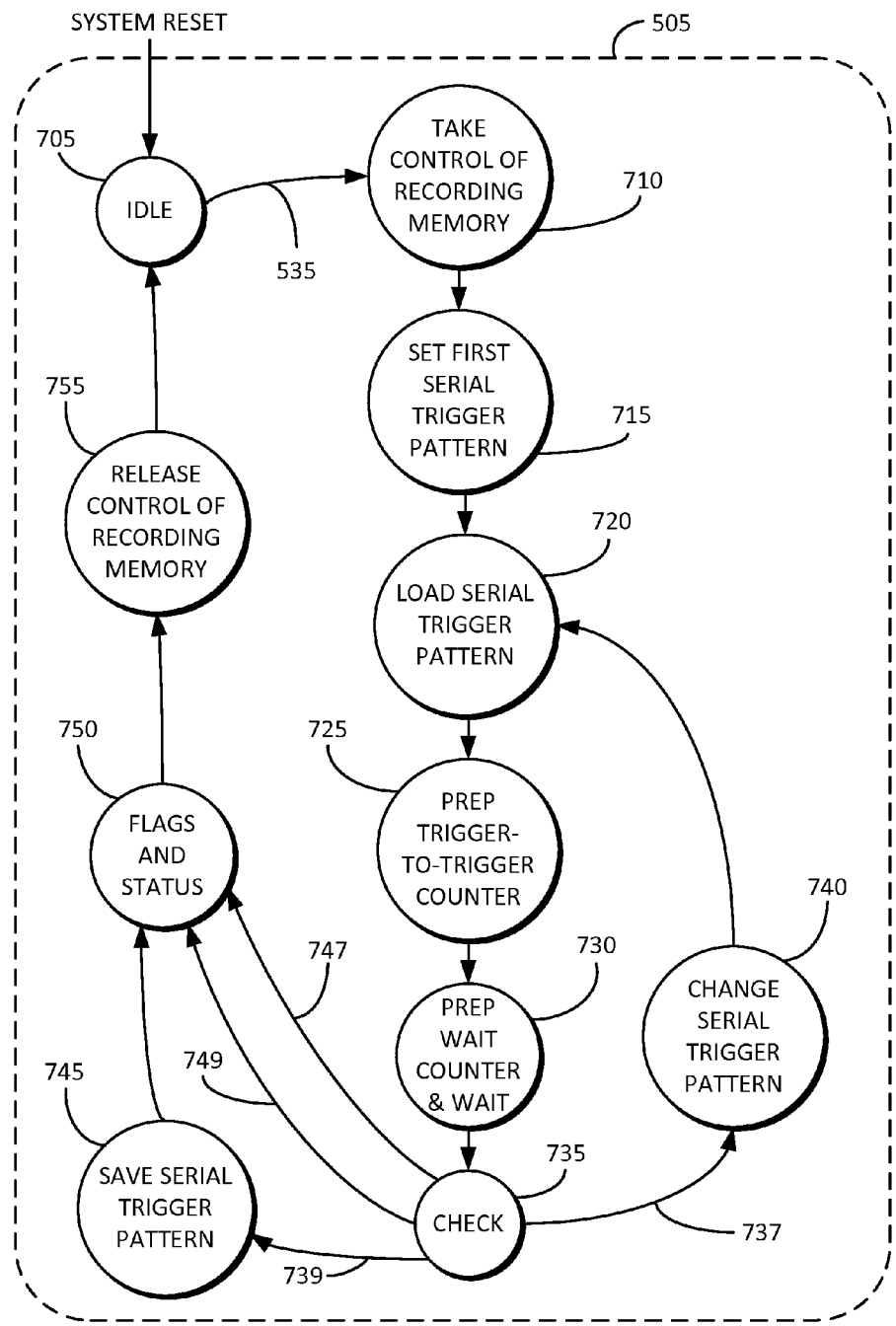
FIG. 7 illustrates an example state machine diagram including various operational elements associated with the auto-sync state machine of FIG. 5.

FIG. 7 illustrates an example state machine diagram including various operational elements associated with the auto-sync state machine 505 of FIG. 5. A system reset puts the auto-sync state machine 505 in an idle state 705. The auto-sync state machine 505 can start operating in response to a write or auto-sync strobe 535. When started, the auto-sync state machine 505 takes control of the recording memory at 710. At 715, the trigger-to-trigger counter 625 and the wait counter 550 can be reset, and the first serial trigger pattern (e.g., 405 of FIG. 4) can be set. The operation proceeds at 720, where the serial trigger pattern is loaded to the serial trigger 630. At 725, the trigger-to-trigger counter 625 can be reset and/or enabled and otherwise prepared to begin counting.

At 730, the wait counter 550 is prepared, which can include resetting or reloading the wait counter. After the wait counter 550 has expired, a check procedure is performed at 735. The check procedure can include checking whether the count generated by the trigger-to-trigger counter 625 is equal to the predefined length of the test pattern. If it is determined that the count is not equal to the predefined length of the test pattern, the operation proceeds along the 737 arrow to 740, where the serial trigger pattern is changed to a new serial trigger pattern, and the operation returns to 720 for further processing. Otherwise, if it is determined that the count is equal to the predefined length of the test pattern, the operation proceeds along arrow 739 to 745, where the serial trigger pattern is saved as the synchronization sub-pattern for later use.

If the auto-sync state machine 505 is reset during the check procedure at 735, then the operation immediately proceeds along arrow 749 to 750, where flags and/or other status pertaining to the auto-sync state machine 505 are updated. If there is no more to test, then the operation proceeds along arrow 747 to 750, where flags and/or other status pertaining to the auto-sync state machine 505 are updated. In addition, after the serial trigger pattern is saved at 745, the operation proceeds to 750, for similar processing. After updating flags or other status, the operation proceeds to 755, where control of the recording memory is released, and the operation returns to an idle state at 705.

It should be understood that the determinations in the state machine diagram 505 in FIG. 7 need not occur in the specific order as described, but rather, these determinations and operations can be made at different times and by the same or different hardware instruments or other suitable digital processors. It will also be understood that the steps described in these techniques need not necessarily occur in the order as illustrated or described.

Figure 8:
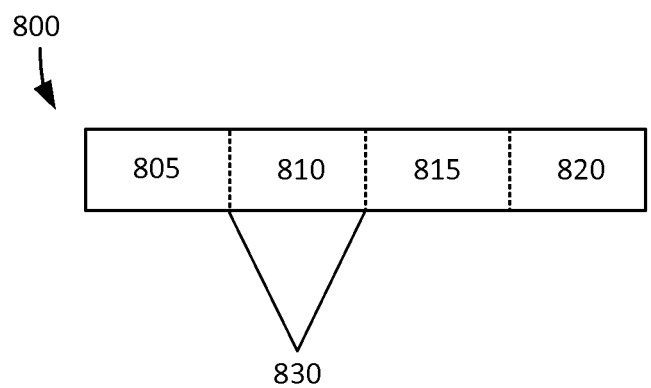
FIG. 8 illustrates a diagram of a repeating synchronization sub-pattern having a unique sub-sub-pattern within the sub-pattern, in accordance with embodiments of the present invention.

FIG. 8 illustrates a diagram of a repeating synchronization sub-pattern 800 having a unique sub-sub-pattern 830 within the sub pattern 800, in accordance with embodiments of the present invention. The synchronization sub-pattern 800 is preferably 40 bits wide, and includes a globally unique 10-bit, 20-bit, 30-bit, or 40-bit sub-sub-pattern that occurs precisely once within the synchronization sub-pattern 800. For example, in the case of a unique 10-bit sub-sub-pattern, the 10 bits indicated by 810 can correspond to the unique sub-sub-pattern 830. Other 10-bit words (e.g., 805, 815, and 820) may be part of the 40-bit sub-sub-pattern but not significant in the sense that only the unique sub-sub-pattern 830 is used to determine the uniqueness of the 40-bit synchronization sub-pattern 800. In this manner, if the 40-bit word that the serial trigger hardware is looking for contains the 10-bit globally unique sub-sub-pattern, then the 40-bit word is also deemed to be unique within the sequence even if the other 30 bits show up in other locations or otherwise have bit errors. As a result, there is less likelihood that a bit error will affect the test. It will be understood that while a 40-bit-wide synchronization sub-pattern is described herein, the embodiments are not limited as such, and any suitable sub-pattern width and sub-sub-pattern widths can be used without departing from the inventive aspects described herein.

By way of further examples, if the overall test pattern is 100,000 bits long, there may be 20,000 test pattern repetitions to search through all possible sequences. If any of the sequences are in error, then there is a chance that the algorithm misses the correct sync point and may have to restart. For a bit error rate of $10^{-9}$, there may be one bit error per 10,000 patterns, which means that there will potentially be two errors during the test. Because each test can examine a 40-bit word (and whether it is repeated within the expected predefined length of a given test pattern), the likelihood of having a bit error exactly when it matters for the serial trigger pattern if every single pattern tested had a bit error, is around $1/1250$. For one error per 10,000 patterns, that probability drops down to about 1/12,500,000. These estimates assume a randomly distributed bit error.

Although the foregoing discussion has focused on particular embodiments, other configurations are contemplated. The following discussion is intended to provide a brief, general description of a suitable machine or machines in which certain aspects of the inventive concept can be implemented. Typically, the machine or machines include a system bus to which is attached processors, memory, e.g., random access memory (RAM), read-only memory (ROM), or other state preserving medium, storage devices, a video interface, and input/output interface ports. The machine or machines can be controlled, at least in part, by input from conventional input devices, such as keyboards, mice, etc., as well as by directives received from another machine, interaction with a virtual reality (VR) environment, biometric feedback, or other input signal. As used herein, the term "machine" is intended to broadly encompass a single machine, a virtual machine, or a system of communicatively coupled machines, virtual machines, or devices operating together. Exemplary machines include computing devices such as personal computers, workstations, servers, portable computers, handheld devices, telephones, tablets, etc., as well as transportation devices, such as private or public transportation, e.g., automobiles, trains, cabs, etc.

The machine or machines can include embedded controllers, such as programmable or non-programmable logic devices or arrays, Application Specific Integrated Circuits (ASICs), embedded computers, smart cards, and the like. The machine or machines can utilize one or more connections to one or more remote machines, such as through a network interface, modem, or other communicative coupling. Machines can be interconnected by way of a physical and/or logical network, such as an intranet, the Internet, local area networks, wide area networks, etc. One skilled in the art will appreciated that network communication can utilize various wired and/or wireless short range or long range carriers and protocols, including radio frequency (RF), satellite, microwave, Institute of Electrical and Electronics Engineers (IEEE) 545.11, Bluetooth®, optical, infrared, cable, laser, etc.

Embodiments of the inventive concept can be described by reference to or in conjunction with associated data including functions, procedures, data structures, application programs, etc. which when accessed by a machine results in the machine performing tasks or defining abstract data types or low-level hardware contexts. Associated data can be stored in, for example, the volatile and/or non-volatile memory, e.g., RAM, ROM, etc., or in other storage devices and their associated storage media, including hard-drives, floppy-disks, optical storage, tapes, flash memory, memory sticks, digital video disks, biological storage, etc. Associated data can be delivered over transmission environments, including the physical and/or logical network, in the form of packets, serial data, parallel data, propagated signals, etc., and can be used in a compressed or encrypted format. Associated data can be used in a distributed environment, and stored locally and/or remotely for machine access. Embodiments of the inventive concept may include a non-transitory machine-readable medium comprising instructions executable by one or more processors, the instructions comprising instructions to perform the elements of the inventive concept as described herein.

Other similar or non-similar modifications can be made without deviating from the intended scope of the inventive concept. Accordingly, the inventive concept is not limited except as by the appended claims.

What is claimed is:

1. A method for automatically identifying a synchronization sub-pattern associated with a test pattern having a predefined length, the method comprising:
   receiving, by an input of a test and measurement instrument, a data stream including the test pattern from a device under test;
   reading from a memory, contents of a memory word associated with a memory address;
   setting the contents of the memory word as a trigger pattern;
   loading the trigger pattern to a trigger;
   triggering the test and measurement instrument in response to detecting a first instance of the trigger pattern in the data stream;
   beginning a count, by a trigger-to-trigger counter, in response to detecting the first instance of the trigger pattern;
   triggering the test and measurement instrument in response to detecting a second instance of the trigger pattern in the data stream;
   ending the count, by the trigger-to-trigger counter, in response to detecting the second instance of the trigger pattern; and
   comparing the count to the predefined length of the test pattern.

2. The method of claim 1, further comprising:
   in response to the count being equal to the predefined length of the test pattern, determining that the trigger pattern is the synchronization sub-pattern associated with the test pattern.

3. The method of claim 1, wherein:
   beginning the count includes beginning a count of time in response to detecting the first instance of the trigger pattern;
   ending the count includes ending the count of time in response to detecting the second instance of the trigger pattern;
   the predefined length of the test pattern is a length of time; and
   comparing includes comparing the count of time to the length of time of the test pattern.

4. The method of claim 1, wherein:
   beginning the count includes beginning a count of characters in response to detecting the first instance of the trigger pattern;
   ending the count includes ending the count of characters in response to detecting the second instance of the trigger pattern;
   the predefined length of the test pattern is a length of characters; and
   comparing includes comparing the count of characters to the length of characters of the test pattern.

5. The method of claim 1, further comprising:
   in response to the count not being equal to the predefined length of the test pattern, determining that the trigger pattern is not the synchronization sub-pattern, and changing the trigger pattern.

6. The method of claim 1, further comprising:
   in response to the count being equal to the predefined length of the test pattern, saving the synchronization sub-pattern.

7. The method of claim 1, further comprising:
   resetting the count.

8. The method of claim 1, further comprising:
   resetting a wait counter;
   beginning a wait count, by the wait counter, in response to detecting the first instance of the trigger pattern; and
   ending the wait count, by the wait counter, in response to the wait count expiring after at least two times the predefined length of the test pattern.

9. The method of claim 8, further comprising:
   determining, within two times the predefined length of the test pattern, whether or not a given trigger pattern is the synchronization sub-pattern.

10. The method of claim 8, further comprising:
    in response to the wait count expiring, stopping the receiving of the data stream and stopping reading from the memory.

11. The method of claim 1, further comprising:
skipping a counting, by the trigger-to-trigger counter, of any aligned primitives in the data stream.

12. The method of claim 1, wherein the memory address is referred to as a first memory address and the memory word is referred to as a first memory word, the method further comprising:
in response to the count not being equal to the predefined length of the test pattern:
reading from the memory contents of a second memory word associated with a second memory address; and
setting the contents of the second memory word as the trigger pattern.

13. The method of claim 1, wherein the memory address is referred to as a first memory address and the memory word is referred to as a first memory word, the method further comprising:
in response to the count not being equal to the predefined length of the test pattern:
for each of a series of iterations, reading from the memory contents of a selected one of 2nd through Nth memory words associated with 2nd through Nth memory addresses, respectively;
for each of the series of iterations, setting the selected one of the 2nd through Nth memory words as the trigger pattern;
for each of the series of iterations, loading the trigger pattern to the trigger, triggering the test and measurement instrument in response to detecting the first instance of the trigger pattern in the data stream, beginning the count in response to detecting the first instance of the trigger pattern, triggering the test and measurement instrument in response to detecting the second instance of the trigger pattern in the data stream, ending the count in response to detecting the second instance of the trigger pattern, and comparing the count to the predefined length of the test pattern; and
in response to the count being equal to the predefined length of the test pattern during any of the series of iterations, determining that the trigger pattern is the synchronization sub-pattern associated with the test pattern, and stopping further iterations.

14. A test and measurement instrument, comprising:
an input configured to receive a data stream including a test pattern having a predefined length;
a memory configured to store a plurality of memory words;
automatic synchronization logic coupled to the memory and configured to read contents of a memory word from among the plurality of memory words, to set the contents of the memory word as a trigger pattern;
a trigger configured to trigger the test and measurement instrument in response to a first instance of the trigger pattern in the data stream and to trigger the test and measurement instrument in response to a second instance of the trigger pattern in the data stream;
a trigger-to-trigger counter configured to begin counting a count, in response to the triggered first instance of the trigger pattern and to end counting the count in response to the triggered second instance of the trigger pattern; and
a comparator configured to compare the count to the predefined length of the test pattern;
the test pattern is associated with a synchronization sub-pattern; and
in response to the count being equal to the predefined length of the test pattern, the automatic synchronization logic is configured to determine that the trigger pattern is the synchronization sub-pattern associated with the test pattern.

15. The test and measurement instrument of claim 14, wherein the predefined length is a length of time and the trigger-to-trigger counter is configured to count time.

16. The test and measurement instrument of claim 14, wherein the predefined length is a length of characters and the trigger-to-trigger counter is configured to count characters.

17. The test and measurement instrument of claim 14, wherein:
the test pattern is associated with a synchronization sub-pattern; and
in response to the count not being equal to the predefined length of the test pattern, the automatic synchronization logic is configured to determine that the trigger pattern is not the synchronization sub-pattern associated with the test pattern, and to change the trigger pattern.

18. The test and measurement instrument of claim 14, further comprising:
a wait counter configured to begin counting a wait count in response to the first instance of the trigger pattern and to end counting the wait count in response to the wait count expiring after at least two times the predefined length of the test pattern.

19. The test and measurement instrument of claim 18, wherein:
in response to the wait count expiring, the input is configured to stop receiving the data stream and the automatic synchronization logic is configured to stop reading from the memory.

20. The test and measurement instrument of claim 14, wherein the automatic synchronization logic is configured to determine, within two times the predefined length of the test pattern, whether or not a given trigger pattern is a synchronization sub-pattern.

21. The test and measurement instrument of claim 14, further comprising a blanking primitive detector configured to cause the trigger-to-trigger counter to skip counting any aligned primitives in the data stream.

22. The test and measurement instrument of claim 14, wherein the trigger pattern corresponds to a synchronization sub-pattern having a globally unique sub-sub-pattern therein.

* * * * *